(12) United States Patent
Pham et al.

(10) Patent No.: US 11,552,622 B1
(45) Date of Patent: Jan. 10, 2023

(54) HIGH-PERFORMANCE FLIP-FLOP

(71) Applicant: SambaNova Systems, Inc., Palo Alto, CA (US)

(72) Inventors: Ha Pham, Palo Alto, CA (US); Jinuk Shin, San Jose, CA (US); Yukio Otaguro, Palo Alto, CA (US)

(73) Assignee: SambaNova Systems, Inc., Palo Alto, CA (US)

( * ) Notice: Subject to any disclaimer, the term of this patent is extended or adjusted under 35 U.S.C. 154(b) by 0 days.

(21) Appl. No.: 17/702,295

(22) Filed: Mar. 23, 2022

(51) Int. Cl.
| H03K 3/289 | (2006.01) |
| H03K 3/356 | (2006.01) |
| H03K 3/037 | (2006.01) |
| H03K 19/20 | (2006.01) |

(52) U.S. Cl.
CPC ........... *H03K 3/0372* (2013.01); *H03K 19/20* (2013.01)

(58) Field of Classification Search
CPC ............. H03K 3/02332; H03K 3/0372; H03K 3/289; H03K 3/3562
USPC ......................................... 327/202, 203, 208
See application file for complete search history.

(56) References Cited

U.S. PATENT DOCUMENTS

| 6,538,471 | B1 | 3/2003 | Stan et al. |
| 6,895,061 | B1 | 5/2005 | Stong |
| 9,941,881 | B1 | 4/2018 | Jung et al. |
| 11,050,423 | B1 * | 6/2021 | Gruber ............... H03K 19/0013 |
| 2009/0251185 | A1 * | 10/2009 | Wu ....................... G06F 1/3203 327/202 |
| 2013/0234753 | A1 * | 9/2013 | Chandrasekharan ....................... H03K 19/0033 326/9 |
| 2013/0261815 | A1 | 10/2013 | Suzuki |
| 2015/0263706 | A1 | 9/2015 | Nakayama |
| 2016/0098506 | A1 | 4/2016 | Agarwal et al. |
| 2018/0123571 | A1 | 5/2018 | Savanth et al. |

(Continued)

FOREIGN PATENT DOCUMENTS

WO 2010142987 A1 12/2010

OTHER PUBLICATIONS

Anonymous, Sequential Logic Circuits and Flip-flops, retrieved on Mar. 22, 2022, 32 pages. Retrieved from the internet [URL: https://www.electronics-tutorials.ws/sequential/seq_1.html ].

(Continued)

*Primary Examiner* — Quan Tra
(74) *Attorney, Agent, or Firm* — Flagship Patents; Sikander Khan; Andre Grouwstra

(57) ABSTRACT

A master-slave flip-flop includes a first latch, a second latch and a tristate driver. The first latch has a combined input/output that is coupled with a common node, a pm output, and an nm output. The tristate driver has pm and nm inputs coupled with the pm and nm outputs of the first latch, and a tristate output coupled with the common node. A pm input signal prevents the tristate driver from pulling the common node high, and an nm input signal prevents the tristate driver from pulling the common node low. The second latch is directly coupled with the common node. The first latch generates an nm signal and a pm signal in response to a signal on the first latch clk input and a state of the common node, wherein the pm signal and the nm signal have opposite polarities when the signal on the first latch clk input has a first value, and equal polarities when the signal on the first latch clk input has a second value.

16 Claims, 9 Drawing Sheets

New Flip-flop Architecture

(56) References Cited

U.S. PATENT DOCUMENTS

2022/0190813 A1    6/2022    Rao

OTHER PUBLICATIONS

Saleh, Lecture-6 Flip-Flop and Clock Design, Depailment of ECE, University of British Columbia, 16 pages.

U.S. Appl. No. 17/551,610 Office Action dated Apr. 18, 2022, 9 pages.

Podobas et al., A Survey on Coarse-Grained Reconfigurable Architectures From a Performance Perspective, IEEEAccess, vol. 2020.3012084, Jul. 27, 2020, 25 pages.

M. Emani et al., "Accelerating Scientific Applications With SambaNova Reconfigurable Dataflow Architecture," in Computing in Science & Engineering, vol. 23, No. 2, pp. 114-119, Mar. 1-Apr. 2021, doi: 10.1109/MCSE.2021.3057203.

Koeplinger et al., Spatial: A Language and Compiler for Application Accelerators, Proceedings of the 39th ACM SIGPLAN Conference on Programming Language Design and Embodiment (PLDI), Proceedings of the 43rd International Symposium on Computer Architecture, 2018.

Prabhakar et. al., "Plasticine: A Reconfigurable Architecture for Parallel Patterns", ISCA '17, Jun. 24-28, 2017, Toronto, ON, Canada.

Vaswani et al., Attention Is All You Need, Advances in Neural Information Processing Systems 2017, dated Dec. 6, 2017, 15 pages.

Devlin et al., BERT: Pre-training of Deep Bidirectional Transformers for Language Understanding, dated May 24, 2019, 16 pages.

U.S. Appl. No. 17/551,610 Final Office Action dated Jul. 27, 2022, 10 pages.

U.S. Appl. No. 17/551,610—Notice of Allowance, dated Aug. 26, 2022, 11 pages.

* cited by examiner

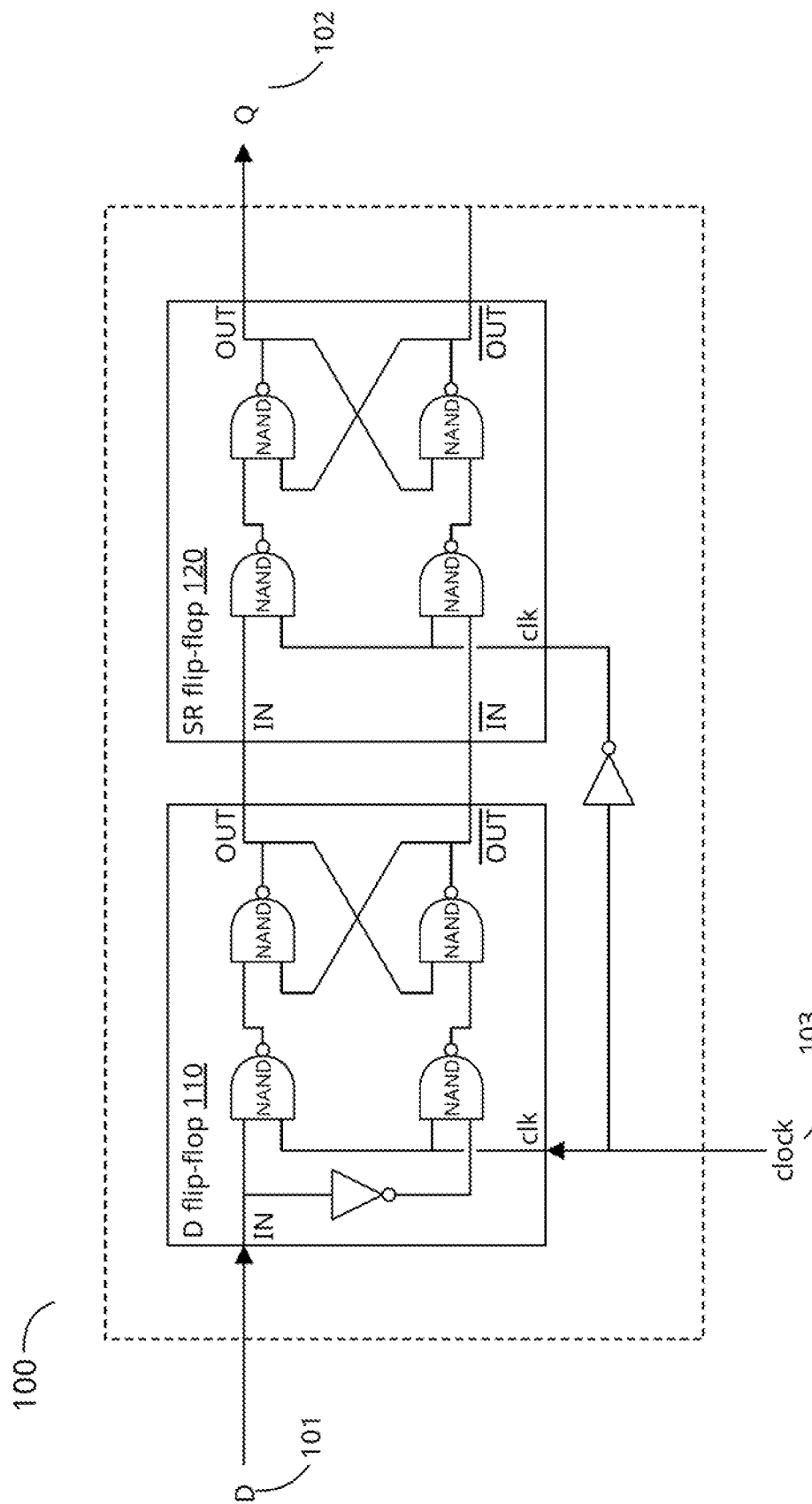
FIG. 1 – Master-Slave D Flip-flop – Prior Art

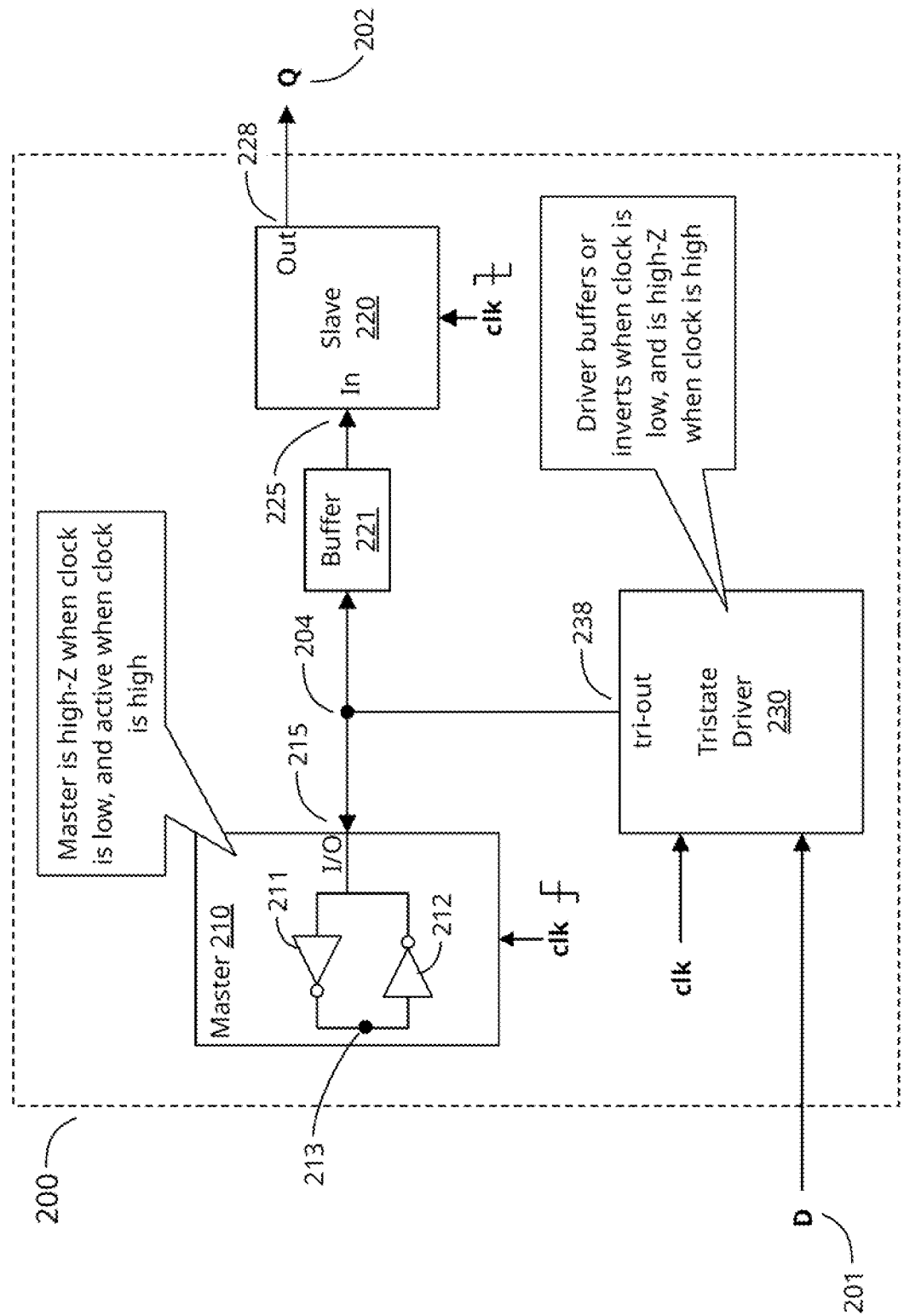
FIG. 2 – Master-Slave D Flip-flop – Prior Art

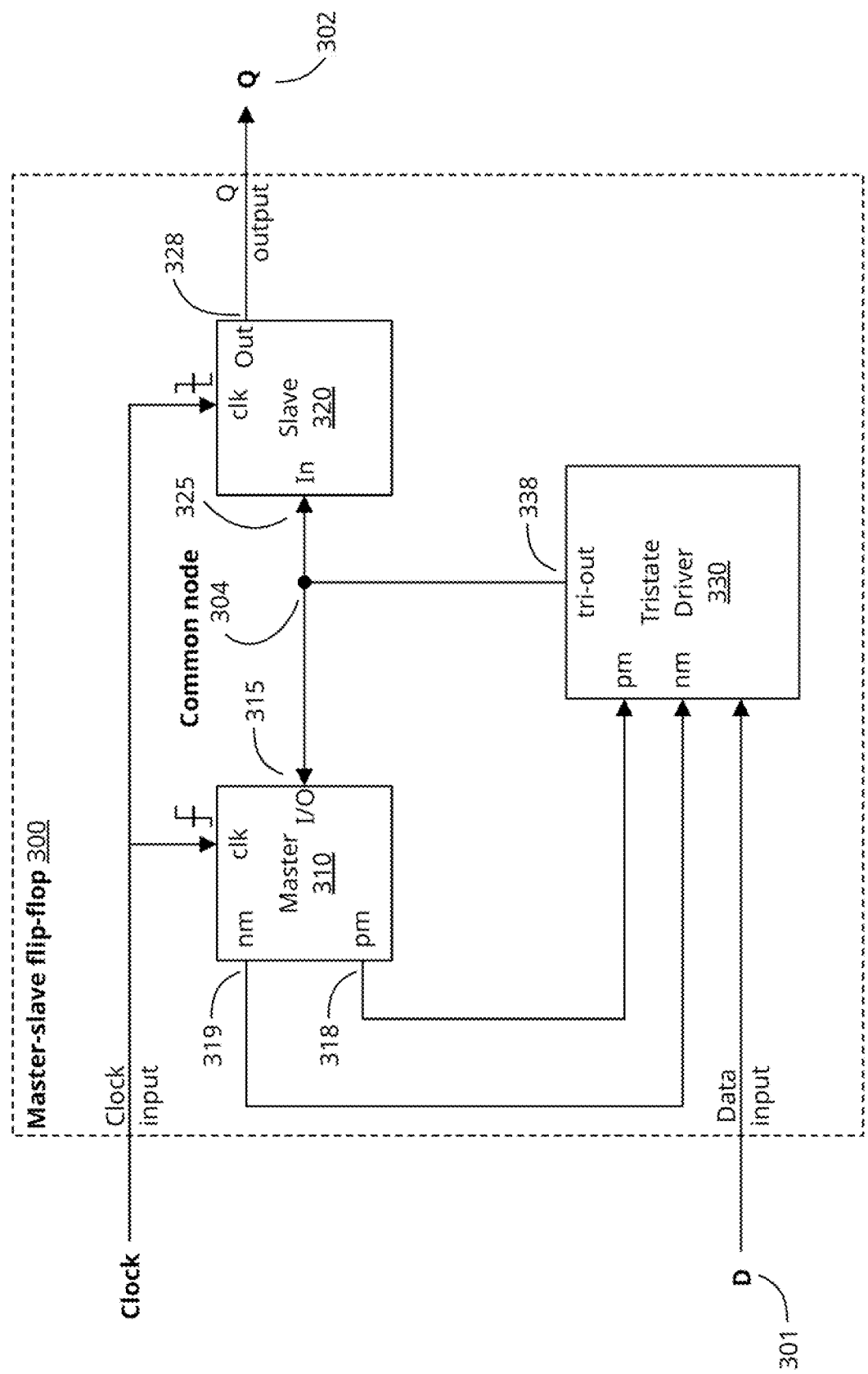
FIG. 3 - New Flip-flop Architecture

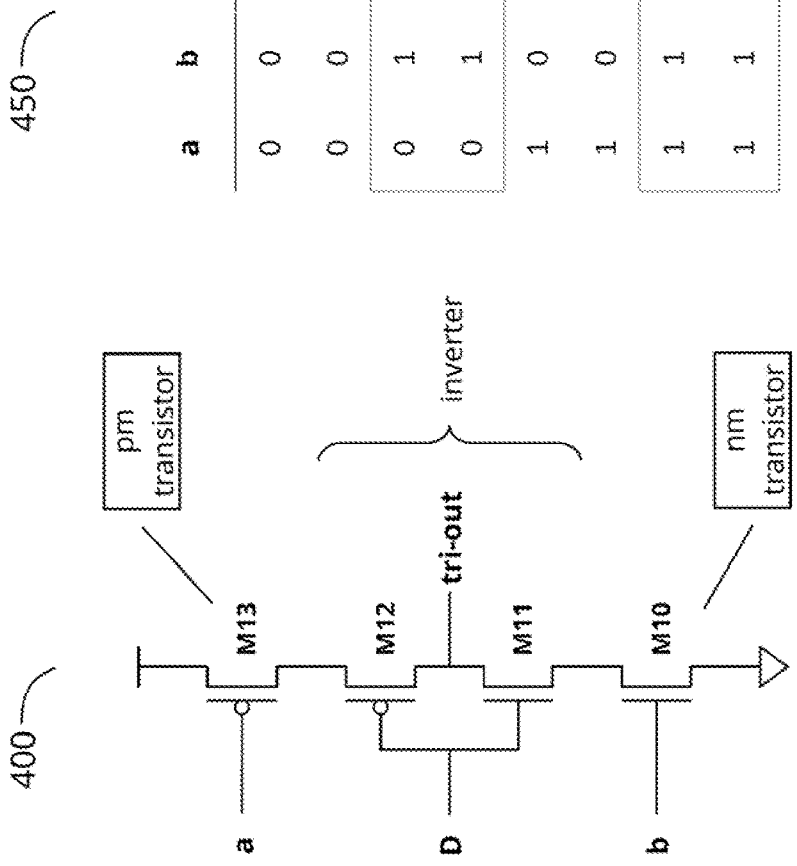
FIG. 4 - A Tristate Driver

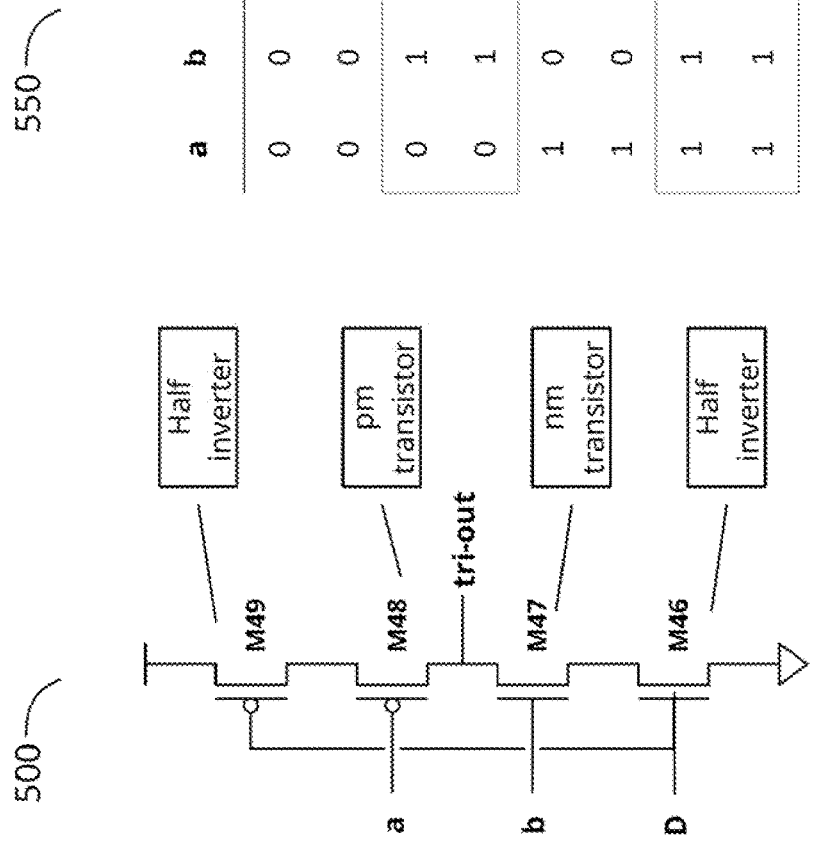
FIG. 5 - An Alternative Tristate Driver

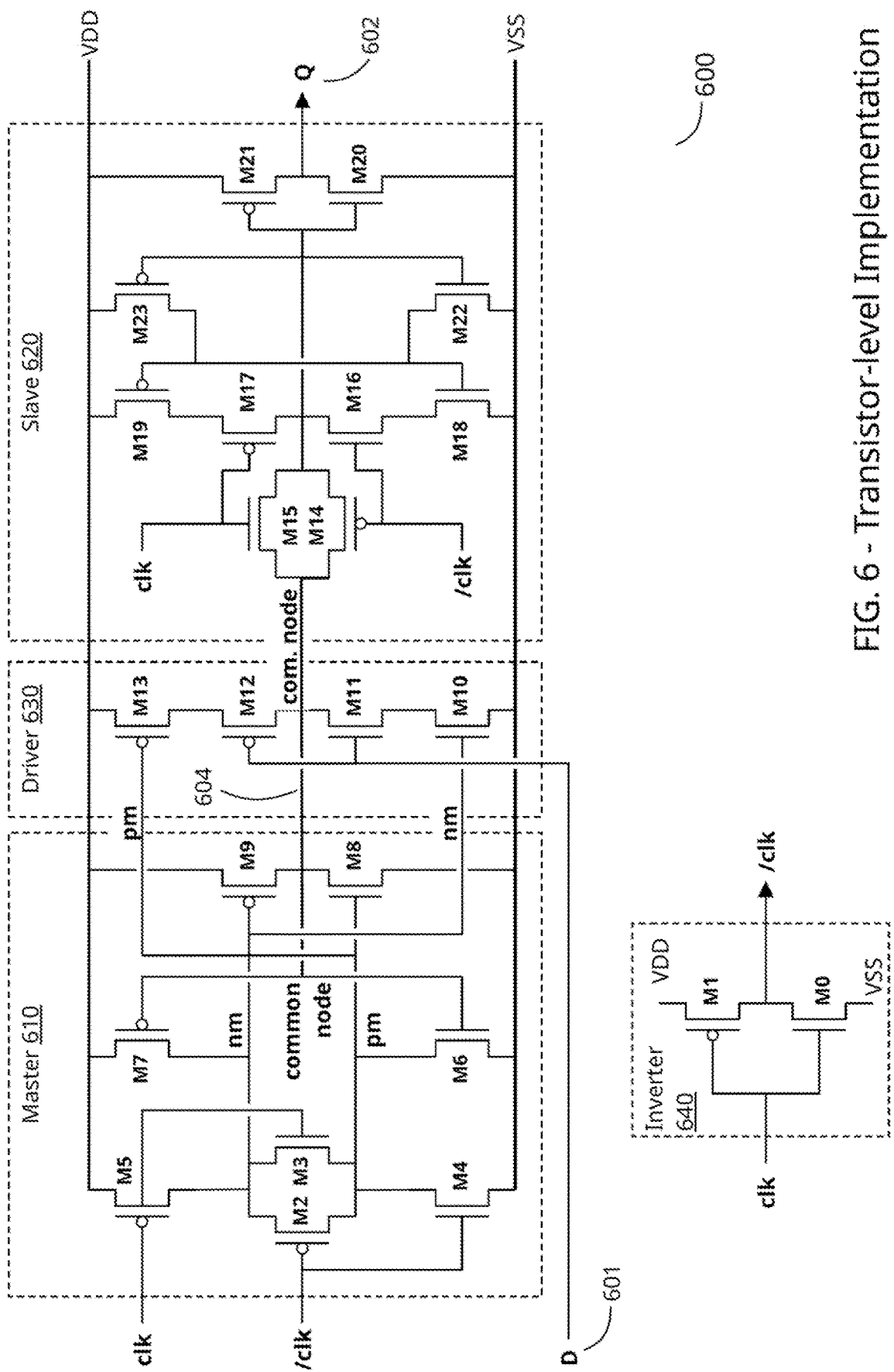
FIG. 6 – Transistor-level Implementation

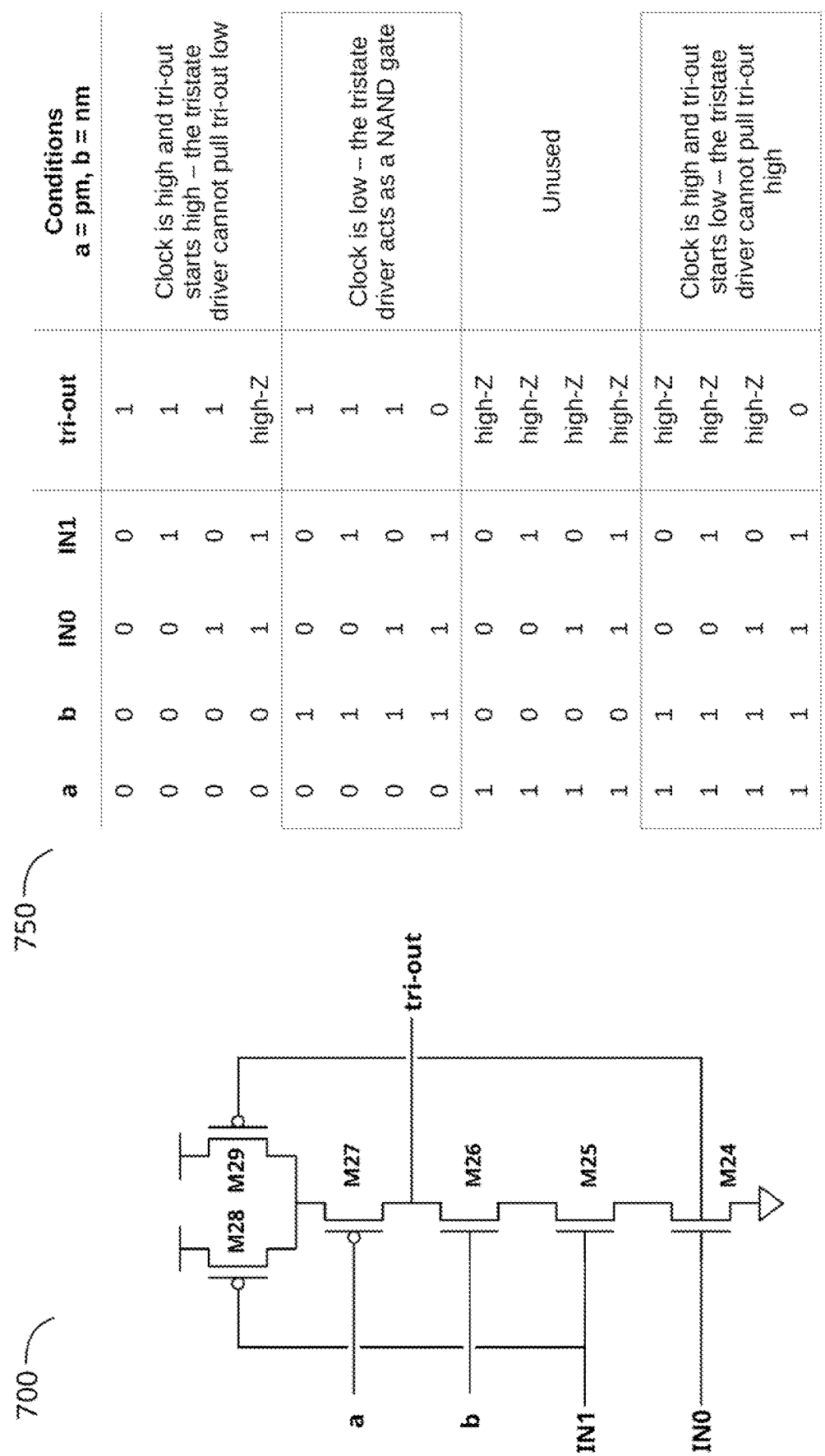
FIG. 7 - Tristate Driver with NAND Input

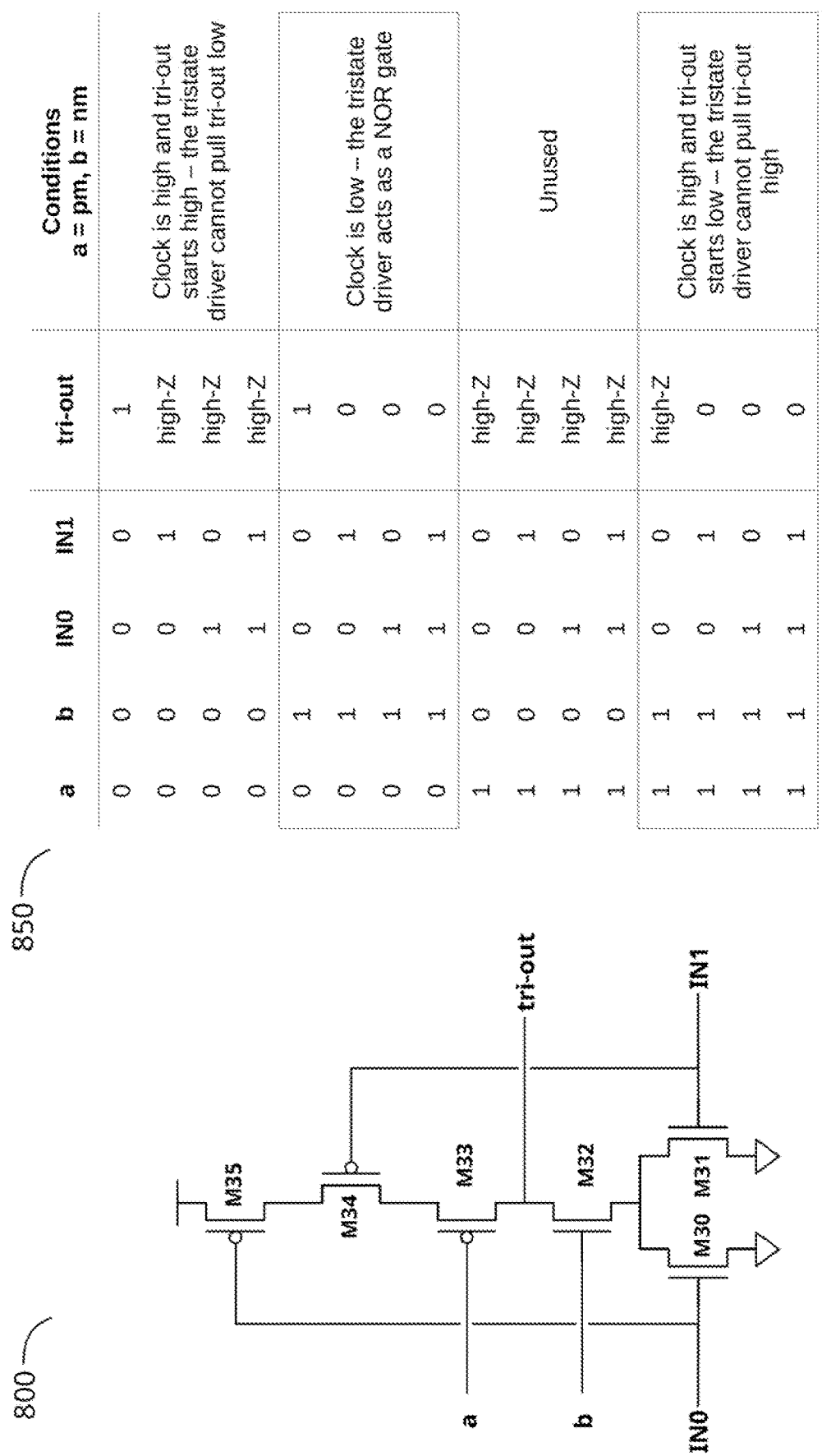
FIG. 8 - Tristate Driver with NOR Input

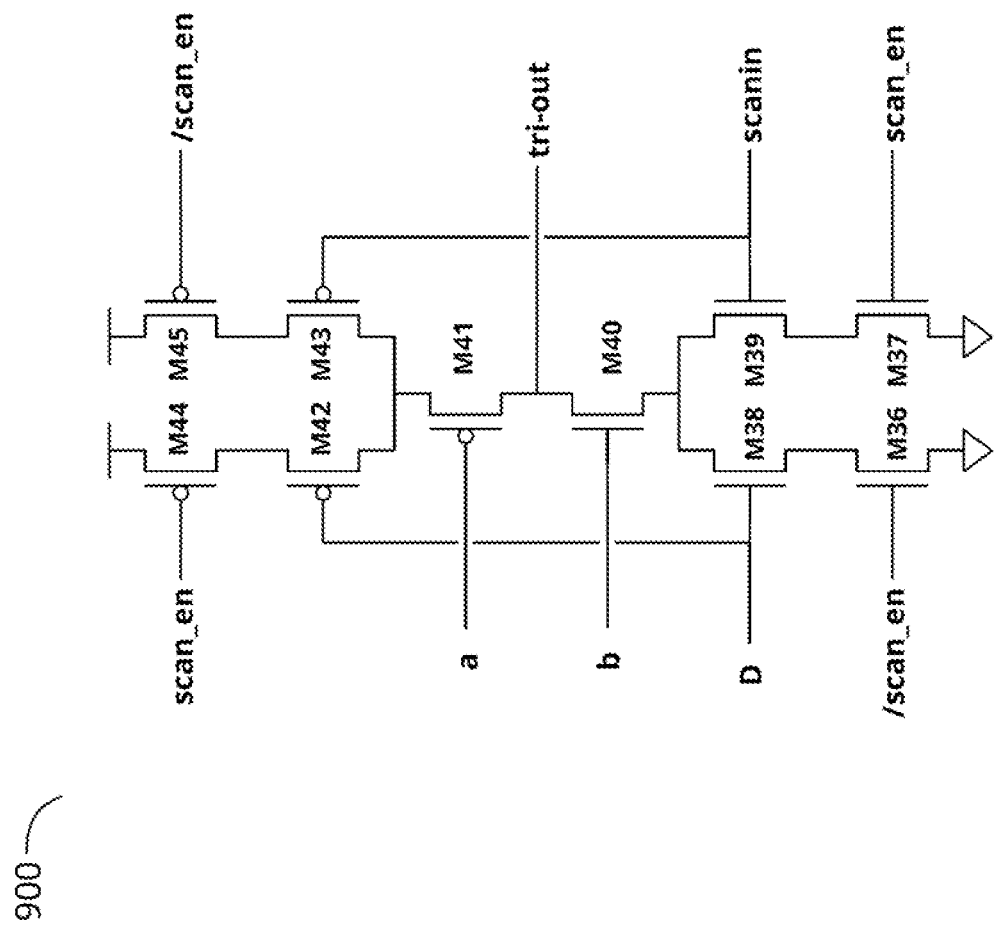
FIG. 9 - Tristate Driver with Scan Multiplexer

HIGH-PERFORMANCE FLIP-FLOP

BACKGROUND

Technical Field

The technology disclosed relates to digital integrated circuits, and in particular to master-slave flip-flops.

Context

The subject matter discussed in this section should not be assumed to be prior art merely as a result of its mention in this section. Similarly, a problem mentioned in this section or associated with the subject matter provided as background should not be assumed to have been previously recognized in the prior art. The subject matter in this section merely represents different approaches, which in and of themselves can also correspond to implementations of the claimed technology.

Flip-flops are among the oldest and most used digital circuits. Billions are produced in integrated circuits (ICs) every day. It is generally acknowledged that the "overhead", i.e., the sum of the setup time and the clock output delay (clock-to-Q), is among the most important performance metrics. Conventional architectures have not very well addressed this metric.

SUMMARY

In an aspect of the disclosed technology, an implementation provides a master-slave flip-flop with a first data input, a clock input, and a Q output. The master-slave flip-flop includes a first latch, a second latch, and a tristate driver. The first latch has a combined input/output that is coupled with a common node, a clk input coupled with the clock input, a pm output, and an nm output. The tristate driver has a data input coupled with the first data input, pm and nm inputs coupled with the pm and nm outputs of the first latch, and a tristate output coupled with the common node. A signal on the pm input prevents the tristate driver from pulling the common node high, and a signal on the nm input prevents the tristate driver from pulling the common node low. The second latch has an input that may be directly coupled with the common node. Its output is coupled with the Q output.

The first latch generates an nm signal and a pm signal in response to a signal on the first latch clk input and a state of the common node, wherein the pm signal and the nm signal have opposite polarities when the signal on the first latch clk input has a first value, and equal polarities when the signal on the first latch clk input has a second value.

The tristate driver comprises a pm transistor that prevents the tristate driver from pulling the common node high when a pm signal is applied, an nm transistor that prevents the tristate driver from pulling the common node low when an nm signal is applied, and a buffer. The buffer may include an inverter, a NAND gate, a NOR gate, a scan multiplexer, or any other functionality.

The first latch may comprise: a p-type transistor M2 with a gate coupled with an inverse clk input, a source coupled with the nm output, and a drain coupled with the pm output; an n-type transistor M3 with a gate coupled with the clk input, a source coupled with the pm output, and a drain coupled with the nm output; an n-type transistor M4 with a gate coupled with the inverse clk input, a source coupled with a second voltage source terminal, and a drain coupled with the pm output; a p-type transistor M5 with a gate coupled with the clk input, with a source coupled with a first voltage source terminal, and a drain coupled with the nm output; an n-type transistor M6 with a gate coupled with the combined input/output, a source coupled with a second terminal, and a drain coupled with the pm output; a p-type transistor M7 with a gate coupled with the combined input/output, a source coupled with a first terminal, and a drain coupled with the nm output; an n-type transistor M8 with a gate coupled with the pm output, a source coupled with the second terminal, and a drain coupled with the combined input/output; and a p-type transistor M9 with a gate coupled with the nm output, a source coupled with the first terminal, and a drain coupled with the combined input/output.

Particular aspects of the technology disclosed are described in the claims, specification and drawings.

BRIEF DESCRIPTION OF THE DRAWINGS

FIG. 1 illustrates a conventional master-slave D flip-flop.

FIG. 2 illustrates another conventional master-slave flip-flop.

FIG. 3 illustrates a new architecture for a master-slave flipflop.

FIG. 4 illustrates an example inverting tristate driver.

FIG. 6 illustrates an example transistor-level implementation of the new master-slave D flip-flop.

FIG. 5 illustrates an alternative inverting tristate driver.

FIG. 7 shows an example tristate driver with a NAND input.

FIG. 8 shows an example tristate driver with a NOR input.

FIG. 9 shows an example tristate driver with a scan multiplexer.

In the figures, like reference numbers may indicate functionally similar elements. The systems and methods illustrated in the figures, and described in the Detailed Description below, may be arranged and designed in a wide variety of different implementations. Neither the figures nor the Detailed Description are intended to limit the scope as claimed. Instead, they merely represent examples of different implementations of the disclosed technology.

DETAILED DESCRIPTION

Terminology

As used herein, the phrase "one of" should be interpreted to mean exactly one of the listed items. For example, the phrase "one of A, B, and C" should be interpreted to mean any of: only A, only B, or only C.

As used herein, the phrases "at least one of" and "one or more of" should be interpreted to mean one or more items. For example, the phrase "at least one of A, B, and C" or the phrase "at least one of A, B, or C" should be interpreted to mean any combination of A, B, and/or C.

Unless otherwise specified, the use of ordinal adjectives "first", "second", "third", etc., to describe an object, merely refers to different instances or classes of the object and does not imply any ranking or sequence.

The term "coupled" is used in an operational sense and is not limited to a direct or an indirect coupling. "Coupled to" is generally used in the sense of directly coupled, whereas "coupled with" is generally used in the sense of directly or indirectly coupled. "Coupled" in an electronic system may refer to a configuration that allows a flow of information, signals, data, or physical quantities such as electrons between two elements coupled to or coupled with each other. In some cases the flow may be unidirectional, in other cases the flow may be bidirectional or multidirectional. Coupling may be galvanic (in this context meaning that a direct electrical connection exists), capacitive, inductive, electromagnetic, optical, or through any other process allowed by physics.

The term "connected" is used to indicate a direct connection, such as electrical, optical, electromagnetical, or mechanical, between the things that are connected, without any intervening things or devices.

IC—integrated circuit—this may be a monolithically integrated circuit, i.e., a single semiconductor die that includes a circuit, or it may be a multichip module that includes multiple semiconductor dies in a single package and that may further include a substrate onto which the dies are mounted, and further electronic devices. In some implementations, an IC may include a printed circuit board with various discrete and integrated devices to jointly provide the functions as described herein.

Flip-flop—a circuit that can have two stable states, wherein one state (for example, a low data output voltage) represents a logical "0" and another state (for example, a high data output voltage) represents a logical "1". Some flip-flops have a data input separate from the data output. Some flip-flops have a clock input that limits the time that an input signal can change the flip-flop's stable state.

Latch—a flip-flop that can have two or more stable states. In some cases, the term "latch" refers to a simple bistable circuit that comprises two inverters in a loop configuration.

Introduction

FIG. 1 illustrates a conventional master-slave D flip-flop 100. Master-slave D flip-flop 100 includes a master D flip-flop 110 and a slave SR flip-flop 120. The master D flip-flop 110 has a data input IN, a clock input clk, an output OUT, and an inverting output /OUT. Slave SR flip-flop 120 has a data input IN, an inverted data input /IN, a clock input clk, an output OUT, and an inverting output /OUT. The master D flip-flop 110 OUT and /OUT outputs are connected to the slave SR flip-flop 120 inputs IN and /IN, respectively. The master-slave D flip-flop 100 data signal 101 (D) is provided to the master D flip-flop 110 data input IN. The slave SR flip-flop 120 output OUT is connected with the system's output to provide the output signal 102 (Q). The clock signal 103 (clock) is provided to the clk input of master D flip-flop 110, and an inverted version of clock is provided to the clk input of slave SR flip-flop 120. The architecture of master-slave D flip-flop 100 has been well described and used for decades.

The architecture prevents that the flipflop receive forbidden input signals, and the master-slave configuration can prevent timing issues. Therefore, master-slave D flip-flops, and alternatives such as the master-slave JK flip-flop, are robust and very popular. However, data signals travel through up to five gates, and (falling-edge) clock signals travel through up to three gates. Thus, the robustness of master-slave D flip-flop 100 comes at the price of its speed.

FIG. 2 illustrates another conventional master-slave flip-flop 200. The architecture includes a master latch 210, a slave latch 220, a buffer 221 that may include an inverter, and a tristate driver 230. Each master latch 210, slave latch 220, and tristate driver 230 may receive a clock signal directly or indirectly. Master latch 210 may have a combined master input/output 215 connected to common node 204. Master latch 210 is inactive and has a high impedance (high Z) at master input/output 215 when the clock is low. Slave latch 220 has a slave input 225 coupled with common node 204 via buffer 221, and it has an output 228 that delivers the output signal 202 (Q). Tristate driver 230 receives the input signal 201 (D) at its input and delivers a tri-out signal to common node 204 via its output 238.

Tristate driver 230 may act as a buffer or an inverter when the clock signal is low, and its output 238 is in high-impedance state when the clock signal is high. In this configuration, when the clock signal is low, tristate driver 230 determines the signal tri-out on common node 204. When the clock signal goes high, master latch 210 samples the voltage on common node 204, and retains it as long as the clock remains high.

Although master-slave flip-flop 200 is potentially faster than master-slave D flip-flop 100, it still has some impediments for its speed. For example, when the signal D changes shortly before the time as a rising edge of the clk signal, the tri-out signal may soon follow, but tristate driver 230 enters the process of changing to high-impedance state, and loses its drive strength. Master latch 210 may include a closed loop of inverter 211 and inverter 212, but to change its state, the new value of the tri-out signal must have propagated through inverter 211 to node 213 at the time of the rising edge, otherwise inverter 212 will force common node 204 back to its prior value. Thus, the signal propagation time through inverter 211 impacts the speed with which master-slave flip-flop 200 can respond to changes in input signal 201. Another problem is that buffer 221 adds delay time. But buffer 221 cannot be left out, as it is necessary to prevent that the internal state of slave latch 220 feeds back into common node 204.

Implementations

FIG. 3 illustrates a new architecture for a master-slave flip-flop 300. The architecture includes master latch 310 with a combined master input/output 315 connected to common node 304, slave latch 320, with slave input 325, and tristate driver 330. Master-slave flip-flop 300 has a data input, a clock input, and a Q output. In this architecture, tristate driver 330 does not directly receive a clock signal as in FIG. 2, but instead it receives one or more signals that are dependent on the clock as well as on the state of tri-out as will be described with reference to FIG. 4 and further figures, and that are supplied by master latch 310. In the implementation drawn, master latch 310 delivers an nm signal and a pm signal to tristate driver 330. Master latch 310 has an nm output 319 and a pm output 318 that are coupled with respective inputs of tristate driver 330.

Tristate driver 330 receives an input signal 301 (D) at its input. It has a tristate output 338 (delivering the tri-out signal) that is coupled with common node 304. Slave latch 320 delivers output signal 302 (Q) at its output 328. Compared with the architecture of master-slave flip-flop 200, master-slave flip-flop 300 is faster because master latch 310 prevents tristate driver 330 from changing the signal at common node 304 when the clock is high, and it can respond faster because its internal drivers don't need to be weak. As a result, no buffer or other intervening circuitry is needed between common node 304 and slave latch 320.

Master latch 310 generates the nm signal and the pm signal in response to a signal on its clk input and the state of the common node. The pm signal and the nm signal have opposite polarities when the signal on the clk input has a first value, and equal polarities when the signal on the clk input has a second value. For example, pm and nm may have opposite polarities when the clock is low, and equal polarities (both high or both low) when the clock is high.

FIG. 4 illustrates an example inverting tristate driver 400. In its most basic form, a tristate driver for the technology disclosed herein comprises a pm transistor that prevents the tristate driver from pulling the tristate output high when a pm signal is applied, an nm transistor that prevents the tristate driver from pulling the tristate output low when an nm signal is applied, and a buffer. The buffer may include a function, such as an inverter, a NAND, a NOR, a multiplexer, etc. Tristate driver 400 is implemented with four transistors. Its buffer includes an inverter (transistors M11 and M12). The pm transistor is M13, and the nm transistor is M10. FIG. 4 also shows the tristate driver 400 truth table 450, which lists the output signal tri-out as a function of its input signals a, b, and D.

In the conventional master-slave flip-flop 200 of FIG. 2, the a input receives the clock signal clk, and the b input receives the inverted clock signal/clk. Of the 8 possible input configurations, master-slave flip-flop 200 only uses four: (abD=) 010; 011; 100, and 101. When a=0 and b=1 (in other words, when the clock is low), tri-out is the inverse of D, so tristate driver 400 operates as an inverter. When a=1 and b=0 (i.e., when the clock is high), tri-out is in high-impedance state (high-Z). In that state, the input signal D does not impact the output signal tri-out.

However, the new master-slave flip-flop 300 of FIG. 3 uses the tristate driver differently. It uses 6 of the 8 possible input configurations: (abD=) 000, 001, 010, 011, 110, and 111. Again, when the clock is low, a=0 and b=1 (cases 010 and 011), and tristate driver 400 operates as an inverter.

In master latch 310, when the clock is high, pm and nm (a and b) depend on the state of the common node at the time of the clock transition from low to high, as will be described with reference to FIG. 6. In the case that the common node was low at the time of the clock transition, pm=1 and nm=1 (cases 110 and 111). If D was 1 at the time of the transition (case 111), the common node was low ("0"), because tristate driver 400 was inverting, and tristate driver 400 keeps inverting until D changes to 0, at which time it goes into high-impedance state. Similarly, in the case that D was 0 at the time of the clock transition, pm=0 and nm=0 (case 000). Thus, the common node was high ("1") at the time of the transition, because tristate driver 400 was inverting, and tristate driver 400 keeps inverting until D changes to 1, at which time tristate driver 400 goes into high-impedance state. Implementations of master-slave flip-flop 300 use this inability of tristate driver 400 to keep driving until case 000 changes to 001, and case 111 changes to 110. During this period between a rising clock and a change in the D signal, tristate driver 400 maintains its high drive strength, which obviates the need for a buffer such as buffer 221 in FIG. 2, and it helps a fast transition in master latch 310, should signal D change close to a rising clock edge.

Tristate driver 400 includes an n-type transistor M10 with a gate coupled with an nm input (b), a source coupled with a second voltage source terminal, representing a "low" or "0" signal (e.g., VSS), and a drain. It includes an n-type transistor M11 with a gate coupled with a data input (D), a source coupled with the drain of transistor M10, and a drain coupled with an output (tri-out). It includes a p-type transistor M12 with a gate coupled with the data input, a source, and a drain coupled with the output. It includes a p-type transistor M13 with a gate coupled with a pm input (a), a source coupled with a first voltage source terminal, representing a "high" or "1" signal (e.g., VDD), and a drain coupled with the source of transistor M12.

FIG. 5 illustrates an alternative inverting tristate driver 500. It has the same elements as tristate driver 400. However, their positions have swapped without impacting functionality. Therefore, it has a truth table 550 that is identical to truth table 450. Tristate driver 500 is implemented with four transistors. Its buffer includes an inverter that is split into two halves (transistors M46 and M49). The pm transistor is M48, and the nm transistor is M47. It operates as follows. When transistors M47 and M48 are both conducting (signal a=0 and signal b=1), transistors M46 and M49 form the inverter for the D input, with tri-out as its output. When signal a is 1, the inverter is not able to pull the output high. When signal b is 0, the inverter is not able to pull the output low. When signal a is 1 and signal b is 0, the inverter is fully disabled. However, that configuration is unused in the disclosed technology.

Tristate driver 500 includes an n-type transistor M46 with a gate coupled with a data input (D), a source coupled with a second voltage source terminal, representing a "low" or "0" signal (e.g., VSS), and a drain. It includes an n-type transistor M47 with a gate coupled with an nm input (b), a source coupled with the drain of transistor M46, and a drain coupled with an output (tri-out). It includes a p-type transistor M48 with a gate coupled with a pm input (a), a source, and a drain coupled with the output. It includes a p-type transistor M49 with a gate coupled with the data input, a source coupled with a first voltage source terminal, representing a "high" or "1" signal (e.g., VDD), and a drain coupled with the source of transistor M48.

FIG. 6 illustrates an example transistor-level implementation of the new master-slave flip-flop 600. It takes data signal 601 (D) at its data input and produces output signal 602 (Q) at its Q output. It receives a clock signal at its clk input, and an inverted clock signal at its inverted clk input (/clk). The clock signal may travel through inverter 640 (transistors M0, M1), at whose output the inverted clock signal is available. Both the master and the slave flip-flop use clk and/clk as complementary clock signals. The master latch 610 includes transistors M2-M9. The tristate driver 630 may include transistors M10-M13. The slave latch 620 includes transistors M14-M23. Each master latch 610, slave latch 620, and tristate driver 630 is coupled with common node 604.

Master latch 610 includes a p-type transistor M2 with a gate coupled with the inverse clock input, a source coupled with an nm output, and a drain coupled with a pm output. It includes an n-type transistor M3 with a gate coupled with the clock input, a source coupled with the pm output, and a drain coupled with the nm output. It includes an n-type transistor M4 with a gate coupled with the inverse clock input, a source coupled with a second voltage source terminal, representing a "low" or "0" signal (e.g, VSS), and a drain coupled with the pm output. It includes a p-type transistor M5 with a source coupled with a first voltage source terminal, representing a "high" or "1" signal (e.g., VDD), with a gate coupled with the clock input, and a drain coupled with the nm output. It includes an n-type transistor M6 with a gate coupled with common node 604, a source coupled with the second terminal, and a drain coupled with the pm output. It includes a p-type transistor M7 with a gate coupled with common node 604, a source coupled with the first terminal, and a drain coupled with the nm output. It includes an n-type transistor M8 with a gate coupled with the pm output, a source coupled with the second terminal, and a drain coupled with common node 604. It includes a p-type transistor M9 with a gate coupled with the nm output, a source coupled with the first terminal, and a drain coupled with common node 604.

In one implementation, tristate driver 630 includes an n-type transistor M10 with a gate coupled with the nm output, a source coupled with the second terminal, and a drain. It includes an n-type transistor M11, with a gate coupled with a data D input, a source coupled with the drain of transistor M10, and a drain coupled with common node 604. It includes a p-type transistor M12 with a gate coupled with the data D input, a source, and a drain coupled with common node 604. It includes a p-type transistor M13 with a gate coupled with the pm output, a source coupled with the first terminal, and a drain coupled with the source of transistor M12. In other implementations, tristate driver 630 may include transistors such as described with reference to FIGS. 7-9.

Slave latch 620 follows a conventional topology, and could be implemented as any high-speed flip-flop known in the art. The topology shown with transistors M14-M23 is but one of many suitable implementations.

Although FIG. 6 shows a transistor-level implementation that uses complementary metal-oxide semiconductor (CMOS) transistors, another implementation may use junction field-effect transistors (JFETs), FinFET transistors, bipolar transistors, heterojunction bipolar transistors (HBTs), or any other class of transistors known in the art.

Master latch 610 operates as follows. When the clock clk is low, M2 and M3 (together forming a pass gate or transmission gate) are not conducting. Transistor M4 pulls pm low, and M5 pulls nm high (this matches situations 010 and 011 in truth table 450). In this situation, transistors M8 and M9 are off. Dependent on the voltage on common node 604, transistors M6 and M7 either are off or do not change the voltage on common node 604. E.g., when the voltage on common node 604 is low, only M7 is conducting, pulling nm high (same as M5). When the voltage on common node 604 is high, only M6 is conducting, pulling pm low (same as M4). Thus, as long as the clock clk is low, master latch 610 will not impact the state of the voltage on common node 604.

When the clock clk is high, M2 and M3 are short-circuiting pm to nm (this covers situations 000, 001, 110, and 111 in truth table 450). M4 and M5 are off. M6-M9 now form a latch, having their positive feedback path enabled via M2 and M3. The complete loop, starting at tri-out, is: (gates) of M6 and M7, pm and nm (short-circuited), gates of M8 and M9, common node 604. The latch input signal is the voltage on common node 604. If the voltage on common node 604 is low, then M7 will conduct, and both nm and pm will be high (situation 111 in truth table 450). Thus, M8 conducts and M9 is off, which keeps the voltage on common node 604 pulled low. If the voltage on common node 604 is high, then M6 will conduct, and both pm and nm will be low (situation 000 in truth table 450). Thus, M8 is off and M9 conducts, which keeps the voltage on common node 604 pulled high.

Summarizing, when the clock clk is low, master latch 610 has no effect on the voltage on common node 604. Instead, the voltage on common node 604 is determined by tristate driver 630 and is the inverse of data signal 601. When clk is high, master latch 610 is active and holds the state of the voltage on common node 604 at the time when the clock transitioned from low to high. Should D change while clk is high, then, according to the three-state driver truth table, tristate driver 630 gets into a high-Z state, and is not able to change the voltage on common node 604.

FIG. 7 shows an example tristate driver 700 with a NAND input. By incorporating a NAND gate in the tristate driver, an application can prevent driving tristate driver 400 by a separate NAND gate delivering an intermediate D signal, which would have a longer total delay time. Tristate driver 700 may be implemented with six transistors. Its buffer includes a NAND gate (transistors M24-M25 and M28-M29). The pm transistor is M27, and the nm transistor is M26. The function of tristate driver 700 in master-slave flip-flop 300 is shown in truth table 750. Since there are four inputs (a, b, IN0 and IN1), there are 16 possible input cases, of which an implementation uses 12 (cases 0000-0111 and 1100-1111). When a=0 and b=1 (cases 0100-0111), tristate driver 700 acts as a regular NAND gate because M26 and M27 are both conducting, exposing M24-M25 and M28-M29 as a NAND gate. When a=0 and b=0 (cases 0000-0011), the output is 1 or high impedance, and tristate driver 700 cannot pull it low. When a=1 and b=1 (cases 1100-1111), the output is 0 or high impedance, and tristate driver 700 cannot pull it high.

Tristate driver 700 includes an n-type transistor M24 with a gate coupled with an IN0 input, a source coupled with a second voltage source terminal, representing a "low" or "0" signal (e.g, VSS), and a drain. It includes an n-type transistor M25 with a gate coupled with an IN1 input, a source coupled with the drain of transistor M24, and a drain. It includes an n-type transistor M26 with a gate coupled with an nm input (b), a source coupled with the drain of transistor M25, and a drain coupled with an output (e.g., tri-out). It includes a p-type transistor M27 with a gate coupled with a pm input (a), a source, and a drain coupled with the output. It includes a p-type transistor M28 with a gate coupled with the IN1 input, a source coupled with a first voltage source terminal, representing a "high" or "1" signal (e.g., VDD), and a drain coupled with the source of transistor M27. It includes a p-type transistor M29 with a gate coupled with the IN0 input, a source coupled with the first voltage source terminal, and a drain coupled with the source of transistor M27.

In a reordering similar to a change from tristate driver 400 to tristate driver 500, which showed that the pm and nm transistor can be either on the outside (FIG. 4) or on the inside (FIG. 5), the transistors in tristate driver 700 which has the pm and nm transistors on the inside may be reordered, such that the pm and nm transistors are directly coupled with VDD and VSS, respectively, and the two halves of the NAND gate are joined in the middle, directly driving the output tri-out.

FIG. 8 shows an example tristate driver 800 with a NOR input. By incorporating a NOR gate in the tristate driver, an application can prevent driving tristate driver 400 by a separate NOR gate delivering an intermediate D signal, which would have a longer total delay time. Tristate driver 800 may be implemented with six transistors. Its buffer includes two halves of the NOR gate (transistors M30-M31 and M34-M35). The pm transistor is M33, and the nm transistor is M32. The function of tristate driver 800 in master-slave flip-flop 300 is shown in truth table 850. Since there are four inputs (a, b, IN0 and IN1), there are 16 possible input cases, of which an implementation uses 12 (cases 0000-0111 and 1100-1111). When a=0 and b=1 (cases 0100-0111), tristate driver 800 acts as a regular NOR gate because M32 and M33 are both conducting, exposing M30-M31 and M34-M35 as a NOR gate. When a=0 and b=0 (cases 0000-0011), the output is 1 or high impedance, and tristate driver 700 cannot pull it low. When a=1 and b=1 (cases 1100-1111), the output is 0 or high impedance, and tristate driver 700 cannot pull it high.

Tristate driver 800 includes an n-type transistor M30 with a gate coupled with an IN0 input, a source coupled with a second voltage source terminal, representing a "low" or "0" signal (e.g, VS S), and a drain. It includes an n-type transistor M31 with a gate coupled with an IN1 input, a source coupled with the second voltage source terminal, and a drain. It includes an n-type transistor M32 with a gate coupled with an nm input (b), a source coupled with the drains of transistors M30 and M31, and a drain coupled with an output (e.g., tri-out). It includes a p-type transistor M33 with a gate coupled with a pm input (a), a source, and a drain coupled with the output. It includes a p-type transistor M34 with a gate coupled with the IN1 input, a drain coupled with the source of transistor M33, and a source. It includes a p-type transistor M35 with a gate coupled with the IN0 input, a source coupled with a first voltage source terminal, representing a "high" or "1" signal (e.g., VDD) and a drain coupled with the source of transistor M34.

In a reordering similar to a change from tristate driver 400 to tristate driver 500, which showed that the pm and nm transistor can be either on the outside (FIG. 4) or on the inside (FIG. 5), the transistors in tristate driver 800 which has the pm and nm transistors on the inside may be reordered, such that the pm and nm transistors are directly coupled with VDD and VSS, respectively, and the two halves of the NOR gate are joined in the middle, directly driving the output tri-out.

FIG. 9 shows an example tristate driver 900 with a scan multiplexer. By incorporating a scan multiplexer in the tristate driver, an application can prevent driving tristate driver 400 by a separate scan multiplexer delivering an intermediate signals, which would have a longer total delay time. Tristate driver 900 may be implemented with eight transistors. Its buffer includes the scan multiplexer (transistors M36-M39 and M42-M45). The pm transistor is M41, and the nm transistor is M40. Tristate driver 900 operates as follows. Transistor M40, controlled by the b signal, couples the output (tri-out) with transistors M36-M39, or isolates the output from transistors M36-M39. Similarly, transistor M41, controlled by the a signal, couples the output with transistors M42-M45, or isolates the output from transistors M42-M45. Transistors M38 and M39 act as inverters for the D signal and the scanin signal, respectively. However, only one of the two is enabled at a time, since either M36 conducts (/scan_en is high) or M37 conducts (scan_en is high). Thus, when/scan_en is high, input D can impact the output, and when scan_en is high, scanin can impact the output. As a result, transistors M36-M39 act as an inverting multiplexer for the D and scanin signals, capable of pulling the output low. Similarly, transistors M42-M45 act as an inverting multiplexer for the D and scanin signals, capable of pulling the output high. Together, transistors M36-M39 and M42-M45 form a full multiplexer, capable of pulling the output low and high.

Tristate driver 900 includes an n-type transistor M36 with a gate coupled with an inverse scan enable input (/scan-en), a source coupled with a second voltage source terminal, representing a "low" or "0" signal (e.g, VSS), and a drain. It includes an n-type transistor M37 with a gate coupled with a scan enable input (scan-en), a source coupled with the second voltage source terminal, and a drain. It includes an n-type transistor M38 with a gate coupled with a data input (D), a source coupled with the drain of transistor M36, and a drain. It includes an n-type transistor M39 with a gate coupled with a scan input (scanin), a source coupled with the drain of transistor M37, and a drain. It includes an n-type transistor M40 with a gate coupled with an nm input (b), a source coupled with the drains of transistors M38 and M39, and a drain coupled with an output (tri-out). It includes a p-type transistor M41 with a gate coupled with a pm input (a), a source, and a drain coupled with the output. It includes a p-type transistor M42 with a gate coupled with the data input, a source, and a drain coupled with the source of transistor M41. It includes a p-type transistor M43 with a gate coupled with the scan input, a source, and a drain coupled with the source of transistor M41. It includes a p-type transistor M44 with a gate coupled with the scan enable input, a source coupled with a first voltage source terminal, representing a "high" or "1" signal (e.g., VDD), and a drain coupled with the source of transistor M42. It includes a p-type transistor M45 with a gate coupled with the inverse scan enable input, a source coupled with the first voltage source terminal, and a drain coupled with the source of transistor M43.

In a reordering similar to a change from tristate driver 400 to tristate driver 500, which showed that the pm and nm transistor can be either on the outside (FIG. 4) or on the inside (FIG. 5), the transistors in tristate driver 900 which has the pm and nm transistors on the inside may be reordered, such that the pm and nm transistors are directly coupled with VDD and VSS, respectively, and the two halves of the scan multiplexer are joined in the middle, directly driving the output tri-out.

Considerations

We describe various implementations of a master-slave D flip-flop.

The technology disclosed can be practiced as a system, method, or article of manufacture. One or more features of an implementation can be combined with the base implementation. Implementations that are not mutually exclusive are taught to be combinable. One or more features of an implementation can be combined with other implementations. This disclosure periodically reminds the user of these options. Omission from some implementations of recitations that repeat these options should not be taken as limiting the combinations taught in the preceding sections—these recitations are hereby incorporated forward by reference into each of the following implementations.

Although the description has been described with respect to particular implementations thereof, these particular implementations are merely illustrative, and not restrictive. The description may reference specific structural implementations and methods, and does not intend to limit the technology to the specifically disclosed implementations and methods. The technology may be practiced using other features, elements, methods and implementations. Implementations are described to illustrate the present technology, not to limit its scope, which is defined by the claims. Those of ordinary skill in the art recognize a variety of equivalent variations on the description above. For example, although all examples have been described with complementary metal-oxide semiconductor (CMOS) transistors, implementations may use any other types of transistors, and even mix types of transistors within one implementation. Although examples describe circuits connected with a supply voltage (or VDD) and ground (or VSS), any other voltage source terminals representing a high or 1 signal and a low or 0 signal may be used. Although a transistor-level implementation shows the use of the tristate driver presented in FIG. 4, it may instead use any of the tristate drivers presented in FIGS. 5 and 7-9, and indeed any other tristate drivers known in the art that can separately disable pulling down the output signal and/or pulling it up. Although all tristate drivers shown are inverting, an implementation may use a non-inverting tristate driver. Although the tristate drivers in FIGS. 7-9 all have their nm and pm transistors in the middle directly driving their tri-out outputs, and the buffer functions are split into two halves, coupled with the VDD and VSS lines, implementations may have their pm transistor at the top, coupled with VDD, the nm transistor at the bottom, coupled with VSS, and the two halves of the buffer function joined in the middle and directly driving the tri-out outputs.

All features disclosed in the specification, including the claims, abstract, and drawings, and all the steps in any method or process disclosed, may be combined in any combination, except combinations where at least some of such features and/or steps are mutually exclusive. Each feature disclosed in the specification, including the claims, abstract, and drawings, can be replaced by alternative features serving the same, equivalent, or similar purpose, unless expressly stated otherwise.

Although the description has been described with respect to particular implementations thereof, these particular implementations are merely illustrative, and not restrictive. For instance, many of the operations can be implemented on a printed circuit board (PCB) using off-the-shelf devices, in a System-on-Chip (SoC), application-specific integrated circuit (ASIC), programmable processor, or in a programmable logic device such as a field-programmable gate array (FPGA), obviating a need for at least part of the dedicated hardware. Implementations may be as a single chip, or as a multi-chip module (MCM) packaging multiple semiconductor dies in a single package. All such variations and modifications are to be considered within the ambit of the present invention the nature of which is to be determined from the foregoing description.

Any suitable technology for manufacturing electronic devices can be used to implement the circuits of particular implementations, including CMOS, FinFET, BiCMOS, bipolar, JFET, MOS, NMOS, PMOS, HBT, MESFET, etc. Different semiconductor materials can be employed, such as silicon, germanium, SiGe, GaAs, InP, GaN, SiC, graphene, etc. Circuits may have single-ended or differential inputs, and single-ended or differential outputs. Terminals to circuits may function as inputs, outputs, both, or be in a high-impedance state, or they may function to receive supply power, a ground reference, a reference voltage, a reference current, or other. Although the physical processing of signals may be presented in a specific order, this order may be changed in different particular implementations. In some particular implementations, multiple elements, devices, or circuits shown as sequential in this specification can be operating in parallel.

It will also be appreciated that one or more of the elements depicted in the drawings/figures can also be implemented in a more separated or integrated manner, or even removed or rendered as inoperable in certain cases, as is useful in accordance with a particular application.

Thus, while particular implementations have been described herein, latitudes of modification, various changes, and substitutions are intended in the foregoing disclosures, and it will be appreciated that in some instances some features of particular implementations will be employed without a corresponding use of other features without departing from the scope and spirit as set forth. Therefore, many modifications may be made to adapt a particular situation or material to the essential scope and spirit.

What is claimed is:

1. A master-slave flip-flop with a first data input, a clock input, and a Q output, comprising:
    a first latch with a combined input/output coupled with a common node, and with a clk input coupled with the clock input;
    a second latch with an input and an output, wherein the input is coupled with the common node, and the output is coupled with the Q output; and
    a tristate driver with an output coupled with the common node, a data input coupled with the first data input, a pm input coupled with a pm output of the first latch, and an nm input coupled with an nm output of the first latch;
wherein:
    a signal on the pm input prevents the tristate driver from pulling the common node high; and
    a signal on the nm input prevents the tristate driver from pulling the common node low.

2. The master-slave flip-flop of claim 1, wherein:
the signal on the pm input is a high voltage and the signal on the nm input is a low voltage.

3. The master-slave flip-flop of claim 1, wherein:
the second latch input is directly connected to the common node without intervening circuitry.

4. The master-slave flip-flop of claim 1, wherein:
the first latch generates an nm signal and a pm signal in response to a signal on the first latch clk input and a state of the common node, wherein the pm signal and the nm signal have opposite polarities when the signal on the first latch clk input has a first value, and equal polarities when the signal on the first latch clk input has a second value.

5. The master-slave flip-flop of claim 4, wherein:
the pm signal and the nm signal have opposite polarities when the signal on the first latch clk input is low, and equal polarities when the signal on the first latch clk input is high.

6. The master-slave flip-flop of claim 1, wherein:
the tristate driver comprises a pm transistor that prevents the tristate driver from pulling the common node high when a pm signal is applied, an nm transistor that prevents the tristate driver from pulling the common node low when an nm signal is applied, and a buffer.

7. The master-slave flip-flop of claim 6, wherein:
the buffer comprises an inverter.

8. The master-slave flip-flop of claim 6, wherein:
the buffer comprises a NAND gate.

9. The master-slave flip-flop of claim 6, wherein:
the buffer comprises a NOR gate.

10. The master-slave flip-flop of claim 6, wherein:
the buffer comprises a scan multiplexer.

11. The master-slave flip-flop of claim 1, wherein the first latch comprises:
    a p-type transistor M2 with a gate coupled with an inverse clk input, a source coupled with the nm output, and a drain coupled with the pm output;
    an n-type transistor M3 with a gate coupled with the clk input, a source coupled with the pm output, and a drain coupled with the nm output;
    an n-type transistor M4 with a gate coupled with the inverse clk input, a source coupled with a second voltage source terminal, and a drain coupled with the pm output;
    a p-type transistor M5 with a gate coupled with the clk input, with a source coupled with a first voltage source terminal, and a drain coupled with the nm output;
    an n-type transistor M6 with a gate coupled with the combined input/output, a source coupled with a second terminal, and a drain coupled with the pm output;
    a p-type transistor M7 with a gate coupled with the combined input/output, a source coupled with a first terminal, and a drain coupled with the nm output;
    an n-type transistor M8 with a gate coupled with the pm output, a source coupled with the second terminal, and a drain coupled with the combined input/output; and
    a p-type transistor M9 with a gate coupled with the nm output, a source coupled with the first terminal, and a drain coupled with the combined input/output.

12. The master-slave flip-flop of claim 1, wherein the tristate driver comprises:
- an n-type transistor M10 with a gate coupled with the nm input, a source coupled with a second voltage source terminal, and a drain;
- an n-type transistor M11 with a gate coupled with the data input, a source coupled with the drain of transistor M10, and a drain coupled with the common node;
- a p-type transistor M12 with a gate coupled with the data input, a source, and a drain coupled with the common node; and
- a p-type transistor M13 with a gate coupled with the pm input, a source coupled with a first voltage source terminal, and a drain coupled with the source of transistor M12.

13. The master-slave flip-flop of claim 1, wherein the tristate driver comprises:
- an n-type transistor M46 with a gate coupled with the data input, a source coupled with a second voltage source terminal, and a drain;
- an n-type transistor M47 with a gate coupled with the nm input, a source coupled with the drain of transistor M46, and a drain coupled with the common node;
- a p-type transistor M48 with a gate coupled with the pm input, a source, and a drain coupled with the common node; and
- a p-type transistor M49 with a gate coupled with the data input, a source coupled with a first voltage source terminal, and a drain coupled with the source of transistor M48.

14. The master-slave flip-flop of claim 1, wherein the tristate driver comprises:
- an n-type transistor M24 with a gate coupled with an IN0 input, a source coupled with a second voltage source terminal, and a drain;
- an n-type transistor M25 with a gate coupled with an IN1 input, a source coupled with the drain of transistor M24, and a drain;
- an n-type transistor M26 with a gate coupled with the nm input, a source coupled with the drain of transistor M25, and a drain coupled with the common node;
- a p-type transistor M27 with a gate coupled with the pm input, a source, and a drain coupled with the common node;
- a p-type transistor M28 with a gate coupled with the IN1 input, a source coupled with a first voltage source terminal, and a drain coupled with the source of transistor M27; and
- a p-type transistor M29 with a gate coupled with the IN0 input, a source coupled with the first voltage source terminal, and a drain coupled with the source of transistor M27.

15. The master-slave flip-flop of claim 1, wherein the tristate driver comprises:
- an n-type transistor M30 with a gate coupled with an IN0 input, a source coupled with a second voltage source terminal, and a drain;
- an n-type transistor M31 with a gate coupled with an IN1 input, a source coupled with the second voltage source terminal, and a drain;
- an n-type transistor M32 with a gate coupled with the nm input, a source coupled with the drains of transistors M30 and M31, and a drain coupled with the common node;
- a p-type transistor M33 with a gate coupled with the pm input, a source, and a drain coupled with the common node;
- a p-type transistor M34 with a gate coupled with the IN1 input, a drain coupled with the source of transistor M33, and a source; and
- a p-type transistor M35 with a gate coupled with the IN0 input, a source coupled with a first voltage source terminal, and a drain coupled with the source of transistor M34.

16. The master-slave flip-flop of claim 1, wherein the tristate driver comprises:
- an n-type transistor M36 with a gate coupled with an inverse scan enable input, a source coupled with a second voltage source terminal, and a drain;
- an n-type transistor M37 with a gate coupled with a scan enable input, a source coupled with the second voltage source terminal, and a drain;
- an n-type transistor M38 with a gate coupled with the data input, a source coupled with the drain of transistor M36, and a drain;
- an n-type transistor M39 with a gate coupled with a scan input, a source coupled with the drain of transistor M37, and a drain;
- an n-type transistor M40 with a gate coupled with the nm input, a source coupled with the drains of transistors M38 and M39, and a drain coupled with the common node, It includes a p-type transistor M41 with a gate coupled with the pm input, a source, and a drain coupled with the common node;
- a p-type transistor M42 with a gate coupled with the data input, a source, and a drain coupled with the source of transistor M41;
- a p-type transistor M43 with a gate coupled with the scan input, a source, and a drain coupled with the source of transistor M41;
- a p-type transistor M44 with a gate coupled with the scan enable input, a source coupled with a first voltage source terminal, and a drain coupled with the source of transistor M42; and
- a p-type transistor M45 with a gate coupled with the inverse scan enable input, a source coupled with the first voltage source terminal, and a drain coupled with the source of transistor M43.

* * * * *